United States Patent [19]

Pan et al.

[11] Patent Number: 5,731,602

[45] Date of Patent: Mar. 24, 1998

[54] LASER DIODE PACKAGE WITH ANTI-REFLECTION AND ANTI-SCATTERING COATING

[75] Inventors: Jing-Jong Pan, Milpitas; Paul Shi-Qi Jiang, San Jose; Jian Chen, San Jose; Li-Hua Wang, San Jose, all of Calif.

[73] Assignee: E-Tek Dynamics, Inc., San Jose, Calif.

[21] Appl. No.: 588,357

[22] Filed: Jan. 18, 1996

[51] Int. Cl.$^6$ .................. H01L 33/00; H01L 31/0203; H01L 31/0232

[52] U.S. Cl. .............. 257/98; 257/99; 257/100; 257/433; 257/435; 257/437; 359/72; 372/36

[58] Field of Search .................. 257/99, 100, 98, 257/433, 787, 435, 437; 359/72; 372/36

[56] References Cited

U.S. PATENT DOCUMENTS

| | | | |
|---|---|---|---|
| 3,609,475 | 9/1971 | Kaposhilin | 257/100 |
| 3,863,075 | 1/1975 | Ironmonger et al. | 257/100 |
| 4,381,881 | 5/1983 | Bell | 350/96.16 |
| 5,243,681 | 9/1993 | Bowen et al. | 359/885 |
| 5,367,196 | 11/1994 | Mahulikar et al. | 257/787 |
| 5,404,368 | 4/1995 | Makita et al. | 372/36 |
| 5,444,558 | 8/1995 | Imanishi et al. | 359/72 |

FOREIGN PATENT DOCUMENTS

| | | | |
|---|---|---|---|
| 63-293890 | 11/1988 | Japan | 257/100 |
| 4-359483 | 12/1992 | Japan | 257/100 |
| 5-27688 | 2/1993 | Japan | 257/100 |

*Primary Examiner*—Carl W. Whitehead
*Assistant Examiner*—T. M. Arroyo
*Attorney, Agent, or Firm*—Townsend and Townsend and Crew LLP

[57] ABSTRACT

The present invention provides for an improved package for a laser diode. The package has portions of its inner surfaces covered with a non-reflecting material, such as simple black paint, non-reflective metals or specific anti-reflection coatings. Such non-reflecting materials surprisingly enhances the performance of packaged laser diodes used as pumping lasers for fiber amplifiers, for example.

17 Claims, 4 Drawing Sheets

Reflectance (%) vs Wavelength (nm)

LASER DIODE PACKAGE WITH ANTI-REFLECTION AND ANTI-SCATTERING COATING

BACKGROUND OF THE INVENTION

The present invention relates to optical fiber technology and, more particularly, to the packaging for laser diodes useful in fiberoptic networks.

In present day optical fiber technology, semiconductor lasers are commonly used to generate and relay light signals through fiberoptic networks. These semiconductor lasers are typically packaged singly or incorporated with other optical elements into a packaged device for connection to the optical fibers of a network. Semiconductor lasers are particularly susceptible to light signal reflections, which cause a laser to become unstable and noisy. Optical isolator assemblies are normally used with the lasers, either as part of a packaged device with a semiconductor laser diode or as a separate optical device in the optical path of the optical fiber coupled to the laser. These isolator devices block reflected signals from reaching the laser and adversely affecting its performance.

The present invention provides for the optimum performance of semiconductor laser diodes with the discovery of a subtle source of reflected light signals which can adversely affect the laser diode. The present invention provides for a surprisingly simple, yet elegant, solution to avoid signals from a subtle source of reflected light to maintain a semiconductor laser at its optimum performance.

SUMMARY OF THE INVENTION

The present invention provides for an improved package for a laser diode. The package has portions of its inner surfaces, which face the laser diode, covered with a non-reflecting material. Simple black paint, non-reflective metal, such as zinc, or anodized metal may be used. An anti-reflection coating of specified thicknesses of germanium, titanium oxide, and silicon dioxide layers over an interior gold layer particularly enhances the performance of the packaged laser diodes used as pumping lasers for fiber amplifiers.

DETAILED DESCRIPTION OF PREFERRED EMBODIMENT(S)

The following is a description of two types of standard packages which are used commonly with laser diodes to provide a clear explanation of the present invention.

For coupling to an optical fiber, a semiconductor laser diode chip is mounted in a package by which electrical connections can be made to the diode and the optical output form the laser diode can be directed into the optical fiber. FIGS. 1A–1C and 2A–2C illustrate dual-in-line and butterfly packages which are commonly used for mounting semiconductor laser diodes. As mentioned above, other optical elements, such as the optical isolator sub-assemblies, are often mounted with the laser diode in these packages.

Figure 1A:
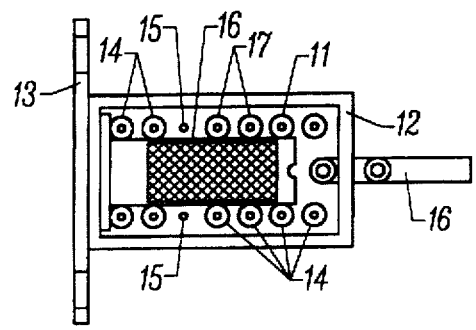
FIG. 1A is a cross-sectional top view of a dual-in-line package for a laser diode according to one embodiment of the present invention.
Figure 1B:
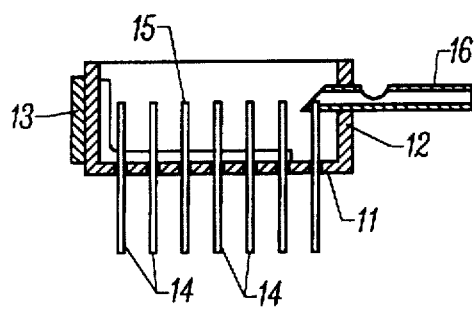
FIG. 1B is a cross-sectional side view of the package of FIG. 1A.
Figure 1C:
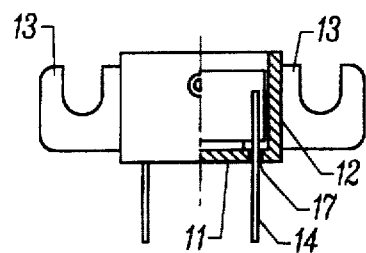
FIG. 1C is a split end view of the package of FIG. 1A.

FIGS. 1A–1C illustrate a dual in-line package for the laser diode. The package has a base 11 and sidewalls 12. Not shown in these drawings is a lid which is fixed to the top edges of the four sidewalls 12 to hermetically seal the package. Through one of the sidewalls 12 there is a fixture 16 for holding the end of an optical fiber which receives the output from the laser diode chip in the package. To the opposite sidewall 12 is fixed a mounting bracket 13 to provide a means of mechanically securing the package. Conductive pins 14 and 15 pass through the bottom 11 to provide an electrical connection to the outside world. For example, some of the pins 14 are used to provide the power source for the laser diode chip. In the base 11 and around each pin 14 is a glass ferrule 17 to insulate the pin 14 from the base 11 and the rest of the package electrically. To provide an electrical ground for the elements in the package, pins 15 are also provided. The pins 15 also ground the package since they do not have the glass cylinders 17 so as to contact the sidewalls of the package also. Not shown are the wires which connect the ends of the pins 14 and 15 in the package to the laser diode chip and other elements in the package.

Optical devices are highly sensitive to distances, dimensions and spacings of the various elements in the device. For that reason, the packages in FIGS. 1A–1C and 2A–2C are made of materials having a very low thermal coefficient of expansion. An iron-nickel-cobalt alloy material of Kovar®, a registered trademark of Goodfellow Corp. of Verwyn, Pa., is typically used for these packages. Additionally, the inside of the packages is completely coated with gold for the rapid transfer of heat from power dissipating elements, such as the semiconductor laser chip, to the external world. Besides being an excellent conductor of electricity, gold is also an excellent conductor of heat. An exception to the gold covering is the glass ferrules 17 which keep the pins 14 electrically isolated from the interior of the package. The ground pins 15 contact the electrically conducting package interior.

Figure 2A:
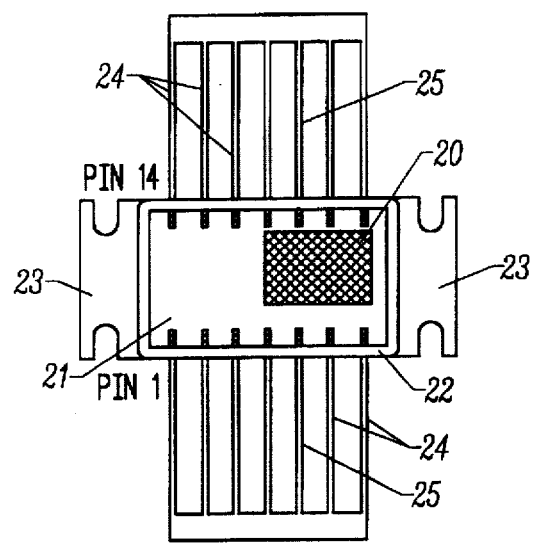
FIG. 2A is a cross-sectional top view of a butterfly package for a laser diode according to another embodiment of the present invention.
Figure 2B:
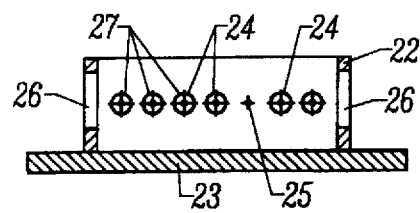
FIG. 2B is a cross-sectional side view of the package of FIG. 2A.
Figure 2C:
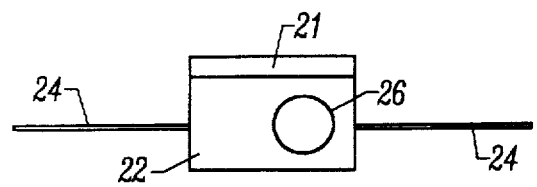
FIG. 2C is an end view of the package of FIG. 2A.

The butterfly package of FIGS. 2A–2C is similarly constructed as the dual-in-line package of FIGS. 1A–1C. The mounting bracket 23 forms a base of the package. Opposite sidewalls 22 have apertures 26 which accept sub-assemblies holding the ends of optical fibers and other optical elements. The sub-assemblies form tight seals with the sidewalls 22. As shown in FIG. 2A, the ends of electrical pins 24 and 25 are connected at the ends by two frames. When in use, these frames are removed to separate the pins 24 and 25 physically and electrically. Glass ferrules 27 insulate the pins 24 from the rest of the package, while the pins 25 are in contact with the gold coating in the interior of package. In FIG. 2C, a lid 21 is also shown for the butterfly package. The interior of the package is also coated with gold for heat removal.

In contrast to the above description, the laser diode packages have been modified according to the present invention. It has been observed that a certain amount of energy from the laser diode chip is inevitably reflected away from its intended direction, i.e., away from the target end of a connecting optical fiber. This energy is small and was previously considered unimportant. The inventors have found that this small amount of reflected and scattered light has a surprisingly large effect upon the operation of the semiconductor laser chip, especially at higher power.

Figure 3A:
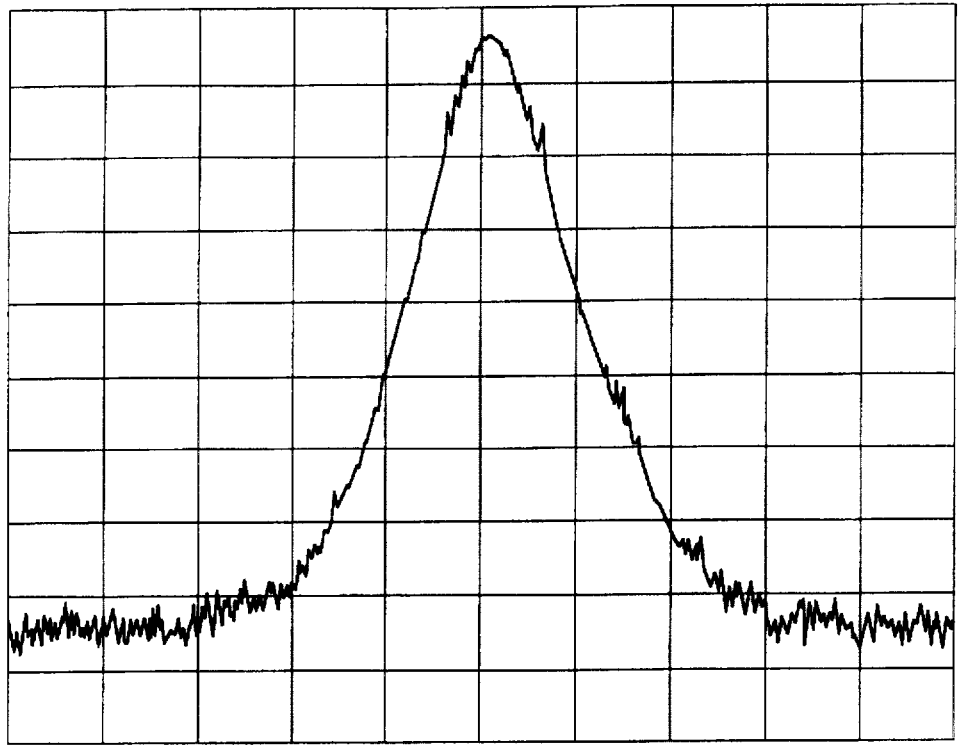
FIG. 3A is a plot of laser signal strength versus signal frequency without the present invention.
Figure 3B:
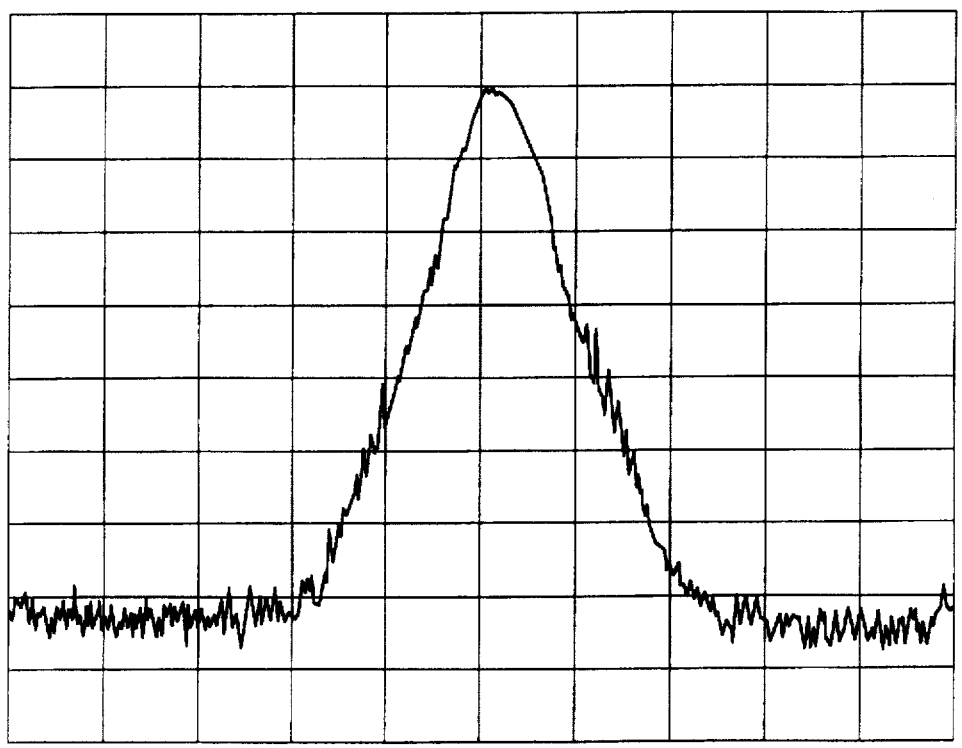
FIG. 3B is another plot of laser signal strength versus signal frequency without the present invention.

FIGS. 3A and 3B plot the operation of a narrow linewidth laser diode in a standard package. The output of the narrow linewidth laser is illustrated in a plot of the output signal amplitude versus frequency. The linewidth around the peak of the signal (determined by the signal amplitude falling to 50% of the peak) is greater than 70 KHz. The slopes around the peak are jagged, indicative of noise modulation on the laser output. Furthermore, it is observed that the peak also jumps about, i.e., the peak intensity of the laser diode is unstable with respect to frequency and in output power. In other words, the resulting laser diode device is noisy, and unstable in terms of spectrum and power.

In contrast, when the interior of the laser diode package is covered with a non-reflecting material, the operation of the laser device improves markedly. As shown in FIGS. 1A and 2A, the interiors of the respective laser diode packages are entirely coated with a non-reflecting material, except for shaded portions 10 and 20 respectively. The shaded portions 10 and 20 retain the gold coating for the thermal dissipation of heat generated by the semiconductor laser diode chip, as in the case of standard laser diode packages. The remaining interior portions of the package, including the lid (not shown in FIGS. 1A–1C) are covered with a non-reflecting material. The particular location and shape of gold-coated regions is dependent upon the particular design of the packaged device using a laser diode chip. For instance, the packages illustrated in FIGS. 1A–1C and 2A–2C are particularly suitable for the WDM coupler described with respect to FIG. 9 in U.S. application Ser. No. 08/361,610, entitled, "WAVELENGTH DIVISION MULTIPLEXED COUPLER WITH LOW CROSSTALK BETWEEN CHANNELS AND INTEGRATED COUPLER/ISOLATOR DEVICE," filed Dec. 21, 1994 and assigned to the present assignee.

The non-reflecting material can be simply black paint. Alternatively, a metal, such as aluminum or chromium, can be sputtered onto the Kovar® alloy in the package interior. The metal is then anodized to blacken the metal. Another method is to black-coat the Kovar® alloy with zinc metal. Zinc black coating has a low reflectivity for light in the ranges typically used for semiconductor laser diodes.

Figure 5:
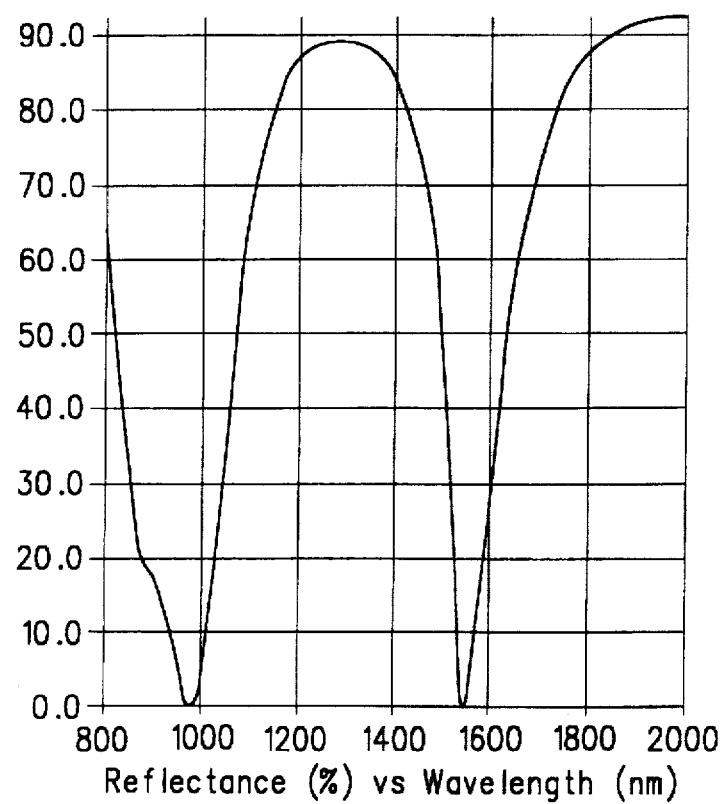
FIG. 5 is a graph plotting reflectance versus wavelength of a non-reflecting layer according to an embodiment of the present invention.

Alternatively, specific anti-reflection coating may be used. Such coatings can be designed to have low reflectivity at targeted wavelengths. For example, an anti-reflection coating of a germanium (Ge) layer of 270 nm (ideally 268.87 nm) thickness, a titanium oxide ($TiO_2$) layer approximately 200 nm (ideally 196.61 nm) thickness, and a silicon dioxide ($SiO_2$) layer of 190 nm (ideally 186.74 nm), deposited over a gold layer has reflective valleys (minimums) at 980 nm and 1550 nm, as shown in FIG. 5. These wavelengths are commonly used today. In fiberoptic networks, a typical arrangement uses a semiconductor laser diode having an output at 980 nm wavelength to pump an erbium-doped fiber amplifier with a output wavelength of 1550 nm. This anti-reflection coating effectively eliminates errant light signals originating from pumping laser diode and from the pumped fiber amplifier.

Figure 4:
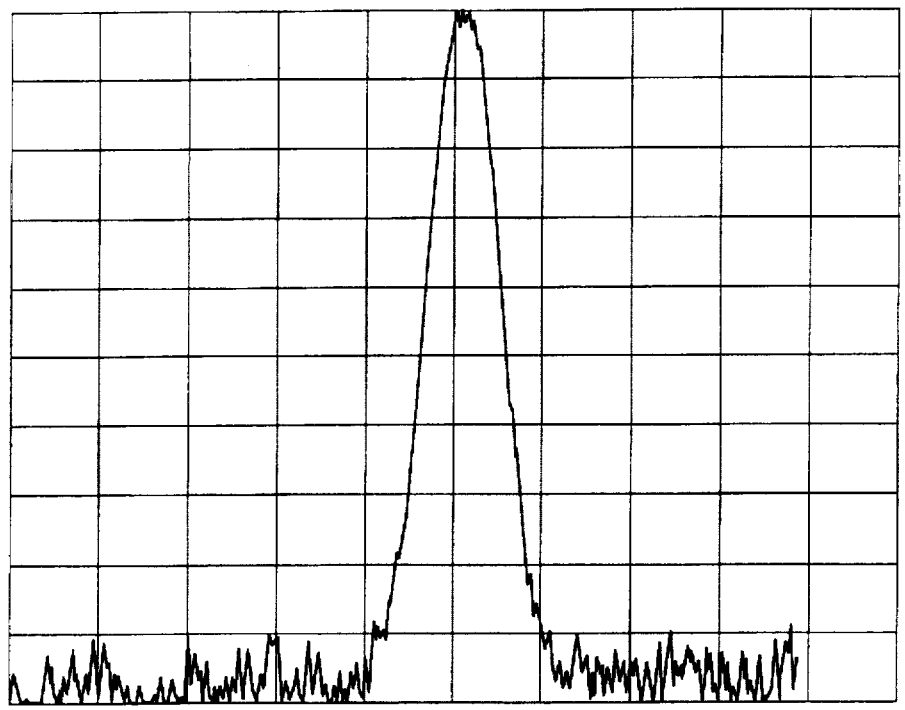
FIG. 4 is a plot of laser signal strength versus signal frequency with the present invention.

The effectiveness of the present invention is illustrated in FIG. 4. The package of the same narrow linewidth laser diode, whose operations are illustrated in FIGS. 3A and 3B, is modified according to the present invention. Black paint covered only the lid of the package and a part of the interior side wall against which reflection was likely. The laser input operating conditions were repeated. The diode output signal is now very much narrowed with a linewidth less than 50 KHz and the sides of the peak are smooth, i.e., the very low noise modulation on the laser output. The peak signal was observed to be steady and its height increased. Thus noise in the output signal is substantially reduced, and the output power and the spectral output is stabilized.

The advantages of this improved package include the narrowing (from 70 to 50 KHz) of the linewidth of the laser output. Narrowing is very important for many optical instruments and fiberoptic telecommunication equipment, especially for the dense WDM systems. Furthermore, narrow linewidth lasers have low intensity noise and phase noise. In a system connected to such lasers, noise degrades a system's signal-to-noise (SNR) ratio. Additionally, low noise modulation from the present invention ensures good short term stability for the laser. (Long term stability is dependent upon temperature and is ensured by cooling the package.) Short term stability provides for good system performance for a WDM system, including better SNR, high channel isolation and low channel crosstalk.

While the above is a complete description of the preferred embodiments of the present invention, various alternatives, modifications and equivalents may be used. It should be evident that the present invention is equally applicable by making appropriate modifications to the embodiment described above. Therefore, the above description should not be taken as limiting the scope of invention which is defined by the metes and bounds of the appended claims.

What is claimed is:

1. An improved package for a single laser diode, said package having opaque inner surfaces facing said laser diode and substantially optically isolating said laser diode, said inner surfaces having portions covered with a non-reflecting material.

2. An improved package for a laser diode, said package having opaque inner surfaces facing said laser diode, said inner surfaces having portions covered with a non-reflecting material, wherein said non-reflecting material comprises first, second and third layers, said first layer comprising $SiO2$, said second layer comprising $TiO2$ and said third layer comprising Ge.

3. The improved package of claim 2 wherein said inner surface comprises gold.

4. The improved package of claim 3 wherein said layer of $SiO2$ is approximately 190 nm, said layer of $TiO2$ is approximately 200 nm and said layer of Ge is approximately 270 nm.

5. The improved package of claim 4 wherein said layer of Ge is on said inner surface portions, said layer of $TiO2$ on said layer of Ge, and said layer of $SiO2$ on said layer of $TiO2$.

6. The improved package of claim 1 wherein said non-reflecting material is particularly absorbent of light at 980 nm and 1550 nm wavelengths.

7. The improved package of claim 1 wherein said non-reflecting material comprises black material.

8. The improved package of claim 7 wherein said non-reflecting material comprises anodized metal.

9. The improved package of claim 1 wherein said non-reflecting material comprises zinc.

10. In a package holding a laser diode and an end of an optical fiber, said package having inner surfaces facing said laser diode and said end of said optical fiber, said inner surfaces being opaque to substantially isolate said laser diode and said end of said optical fiber so that only light from the laser diode enters said optical fiber, the improvement comprising said inner surfaces having portions covered with a non-reflecting material.

11. The improved package of claim 10 wherein said non-reflecting material is particularly absorbent of light at 980 nm and 1550 nm wavelengths.

12. The improved package of claim 10 wherein said non-reflecting material comprises black material.

13. The improved package of claim 12 wherein said non-reflecting material comprises anodized metal.

14. The improved package of claim 10 wherein said non-reflecting material comprises zinc.

15. An assembly comprising:
   a package having opaque inner surfaces which substantially optically isolate a cavity;
   a single laser diode disposed within the cavity, the laser diode capable of producing a light signal; and
   an optical fiber having an end disposed within the cavity, the end in a path of the light of the laser diode;
   wherein at least a portion of the opaque inner surfaces of the package includes a non-reflecting material to prevent a portion of the light which is scattered within the cavity from being reflected by the opaque inner surfaces into the end of the optical fiber.

16. A laser diode assembly comprising:
   a laser diode which produces an optical signal;
   an optical fiber having an end disposed within the optical path of the signal from the laser diode so that a portion of the optical signal enters the optical fiber, and so that an alternative portion of the optical signal does not enter the optical fiber and is scattered; and
   a package surrounding the laser diode and the end of the optical fiber, the package having opaque inner surfaces facing the laser diode;
   wherein the package substantially optically isolates the laser diode from environmental light surrounding the package; and
   wherein at least a portion of the opaque inner surfaces facing the laser diode are non-reflective to prevent the scattered light from being reflected back into the end of the optical fiber.

17. A laser diode as claimed in claim 16, wherein a single laser diode is disposed within the opaque inner surfaces.

* * * * *